United States Patent
Zuo et al.

(10) Patent No.: US 9,935,177 B2
(45) Date of Patent: Apr. 3, 2018

(54) MANUFACTURING METHODS OF THIN FILM TRANSISTOR HAVING AN OHMIC CONTACT REGION AND ARRAY SUBSTRATE INCLUDING THE SAME

(71) Applicant: BOE TECHNOLOGY GROUP CO., LTD., Beijing (CN)

(72) Inventors: Yueping Zuo, Beijing (CN); Liangjian Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/038,174

(22) PCT Filed: Nov. 11, 2015

(86) PCT No.: PCT/CN2015/094280
§ 371 (c)(1),
(2) Date: May 20, 2016

(87) PCT Pub. No.: WO2016/107290
PCT Pub. Date: Jul. 7, 2016

(65) Prior Publication Data
US 2016/0365430 A1 Dec. 15, 2016

(30) Foreign Application Priority Data
Dec. 30, 2014 (CN) .......................... 2014 1 0841792

(51) Int. Cl.
*H01L 29/66* (2006.01)
*H01L 21/265* (2006.01)
(Continued)

(52) U.S. Cl.
CPC ...... *H01L 29/66757* (2013.01); *H01L 21/266* (2013.01); *H01L 21/26513* (2013.01);
(Continued)

(58) Field of Classification Search
None
See application file for complete search history.

(56) References Cited

U.S. PATENT DOCUMENTS 5,227,321 A * 7/1993 Lee .................. H01L 21/266
148/DIG. 143
6,403,409 B1 * 6/2002 You .................. H01L 27/1214
257/E27.111
(Continued)

FOREIGN PATENT DOCUMENTS

CN 790164 A 6/2006
CN 101236904 A 6/2008
(Continued)

OTHER PUBLICATIONS

Ye et al., CN101436544A, May 20, 2009, Machine Translation.*
Office Action dated Nov. 16, 2016 issued in corresponding Chinese Application No. 201410841792.5.
Form PCT/ISA/210 issued in corresponding international application No. PCT/CN2015/094280 dated Feb. 15, 2016.
(Continued)

*Primary Examiner* — Andres Munoz
(74) *Attorney, Agent, or Firm* — Nath, Goldberg & Meyer; Joshua B. Goldberg; Stanley N. Protigal (57) ABSTRACT

Embodiments of the present invention provide a thin film transistor and a manufacturing method thereof, an array substrate including the thin film transistor, and a manufacturing method of the array substrate. The thin film transistor comprises an active layer, a gate insulation layer, a gate, an interlayer insulation layer, a source and a drain formed on a base substrate, the interlayer insulation layer and the gate insulation layer are provided therein with through holes corresponding to the source and the drain; the active layer comprises a source ohmic contact region connected with the source, a drain ohmic contact region connected with the drain, a channel region serving as a channel located below the gate, and a lightly doped region between the drain ohmic contact region and the channel region.

3 Claims, 9 Drawing Sheets

(51) Int. Cl.
    *H01L 21/266* (2006.01)
    *H01L 29/786* (2006.01)
(52) U.S. Cl.
    CPC .. *H01L 29/66492* (2013.01); *H01L 29/78621* (2013.01); *H01L 29/78624* (2013.01); *H01L 29/78696* (2013.01)

(56) References Cited

U.S. PATENT DOCUMENTS

2002/0074550 A1* 6/2002 Itoga ................ H01L 29/66757
                                                          257/72
2007/0045627 A1* 3/2007 Park .................. H01L 27/1214
                                                          257/66

FOREIGN PATENT DOCUMENTS

| CN | 101436544 A | 5/2009 |
| CN | 101840865 A | 9/2010 |
| CN | 103165529 A | 6/2013 |
| CN | 103794566 A | 5/2014 |
| CN | 104465405 A | 3/2015 |

OTHER PUBLICATIONS

Form PCT/ISA/220 issued in corresponding international application No. PCT/CN2015/094280 dated Feb. 15, 2016.
Form PCT/ISA/237 issued in corresponding international application No. PCT/CN2015/094280 dated Feb. 15, 2016.

* cited by examiner

MANUFACTURING METHODS OF THIN FILM TRANSISTOR HAVING AN OHMIC CONTACT REGION AND ARRAY SUBSTRATE INCLUDING THE SAME

This is a National Phase Application filed under 35 U.S.C. 371 as a national stage of PCT/CN2015/094280, filed Nov. 11, 2015, an application claiming the benefit of Chinese Application No. 201410841792.5, filed Dec. 30, 2014, the content of each of which is hereby incorporated by reference in its entirety.

TECHNICAL FIELD

The present invention relates to the field of display technology, and particularly to a thin film transistor and a manufacturing method thereof, an array substrate and a manufacturing method thereof.

BACKGROUND

A liquid crystal display mainly comprises an array substrate, which is provided with pixel units arranged in a matrix form thereon, each pixel unit is provided with a thin film transistor and a pixel electrode therein, wherein the thin film transistor controls the application of voltage to the pixel unit.

Specifically, the thin film transistor comprises an active layer, a gate insulation layer, a gate, an interlayer insulation layer, a source and a drain which are provided sequentially. As for the thin film transistor with above structure, in a case that the thin film transistor is in an off state, there is still a current in the thin film transistor, this current is generally referred as a leakage current of the thin film transistor. Specifically, the leakage current of the thin film transistor includes a main leakage current of the thin film transistor between the source and the drain and an edge leakage current of the thin film transistor consisting of a leakage current between the gate and the source and a leakage current between the gate and the drain, wherein a proportion of the main leakage current of the thin film transistor in the leakage current of the thin film transistor is larger.

Too large leakage current of the thin film transistor may cause disadvantages such as deviation of display gray scale of the pixel electrode of the liquid crystal display, and increased energy consumption of the liquid crystal.

SUMMARY OF THE INVENTION

In view of the above problems, the present invention provides a manufacturing method of a thin film transistor and a manufacturing method of an array substrate, which can decrease the leakage current of the thin film transistor.

To solve the above problems, one aspect of the present invention provides a manufacturing method of a thin film transistor, comprising steps of:

S01, forming an active layer on a base substrate;
S02, forming a gate insulation layer on the active layer;
S03, forming a gate metal layer on the gate insulation layer;
S04, forming a layer of patterned photoresist, which is completely located within a region where the active layer is located;
S05, over-etching the gate metal layer to form a gate, so that the photoresist is suspended at two ends thereof;
S06, performing ion implantation on the active layer, so that a region of the active layer not shielded by the photoresist and the gate becomes an ohmic contact region;
S07, removing a part of the gate and/or a part of the photoresist on the gate, so as to expose a portion of the active layer adjacent to the ohmic contact region;
S08, performing ion implantation on the active layer so that the exposed portion of the active layer adjacent to the ohmic contact region becomes a lightly doped region, and the portion of the active layer shielded by the photoresist and/or the gate becomes a channel region;
S09, stripping off the photoresist;
S10, forming an interlayer insulation layer above the gate, and forming through holes in the interlayer insulation layer and the gate insulation layer by a patterning process above the ohmic contact region; and
S11, forming a source-drain metal layer above the interlayer insulation layer and in the through holes, and forming a source and a drain through a patterning process, wherein the source and the drain are electrically connected to the ohmic contact region through the through holes respectively.

Preferably, the step S04 further comprises a step of:
forming the photoresist to include a completely preserved area and partially preserved areas located at two ends of the completely preserved area, and the step S05 further comprises steps of:
over-etching the gate metal layer to form a pre-gate-structure, so that the partially preserved area at one end of the completely preserved area is suspended, and a part of the partially preserved area at the other end of the completely preserved area is suspended; and
removing the partially preserved area of the photoresist by an ashing process, so that a part of the pre-gate-structure covered by the partially suspended partially preserved area is exposed, and thinning the completely preserved area.

Preferably, the ohmic contact region includes a source ohmic contact region and a drain ohmic contact region, and the step S06 further comprises a step of:
performing ion implantation on the active layer, so that regions of the active layer not shielded by the photoresist and/or the pre-gate-structure become the source ohmic contact region and the drain ohmic contact region, the step S07 further comprises a step of:
removing the exposed portion of the pre-gate-structure by etching to form the gate covered by the photoresist, so that a portion of the active layer adjacent to the drain ohmic contact region is exposed, and the step S08 further comprises a step of:
performing ion implantation on the active layer so that the exposed portion of the active layer adjacent to the ohmic contact region becomes a lightly doped region, and the portion of the active layer shielded by both the photoresist and the gate becomes a channel region.

Preferably, the step S04 further comprises a step of:
forming the photoresist to include a completely preserved area and a partially preserved area located at one end of the completely preserved area, and the step S05 further comprises steps of:
over-etching the gate metal layer to form the gate, so that the partially preserved area is suspended, and an end of the completely preserved area not connected to the partially preserved area is suspended; and
removing the partially preserved area of the photoresist by an ashing process, and thinning the completely preserved area.

Preferably, the ohmic contact region includes a source ohmic contact region and a drain ohmic contact region, and the step S06 further comprises a step of:

performing ion implantation on the active layer, so that regions of the active layer not shielded by the photoresist and/or the gate become the source ohmic contact region and the drain ohmic contact region, respectively, the step S07 further comprises a step of:

stripping off the photoresist so as to expose a portion of the active layer adjacent to the drain ohmic contact region, and the step S08 further comprises a step of:

performing ion implantation on the active layer so that the exposed portion of the active layer adjacent to the drain ohmic contact region becomes a lightly doped region, and the portion of the active layer shielded by the photoresist becomes the channel region.

Preferably, the step S04 further comprises a step of:

forming the photoresist to include a completely preserved area and partially preserved areas located at two ends of the completely preserved area, and the step S05 further comprises steps of:

over-etching the gate metal layer to form a pre-gate-structure, so that the partially preserved areas at two ends of the completely preserved area are partially suspended, and removing the partially preserved areas of the photoresist by an ashing process, so that parts of the pre-gate-structure covered by the partially preserved areas are exposed from the completely preserved area at two ends thereof, and thinning the completely preserved area.

Preferably, the ohmic contact region includes a source ohmic contact region and a drain ohmic contact region, and the step S06 further comprises a step of:

performing ion implantation on the active layer, so that regions of the active layer not shielded by the photoresist and/or the pre-gate-structure become the source ohmic contact region and the drain ohmic contact region, respectively, the step S07 further comprises a step of:

etching to remove the exposed portion of the pre-gate-structure to form the gate, and expose two portions of the active layer adjacent to the source ohmic contact region and the drain ohmic contact region, wherein the gate is covered by the photoresist thereon, and the step S08 further comprises a step of:

performing ion implantation on the active layer so that the two exposed portions of the active layer after etching the pre-gate-structure become lightly doped regions, and the portion of the active layer shielded by both the photoresist and the gate becomes the channel region.

Preferably, the ohmic contact region includes a source ohmic contact region and a drain ohmic contact region, and the step S06 further comprises a step of:

performing ion implantation on the active layer, so that regions of the active layer not shielded by the photoresist and/or the gate become the source ohmic contact region and the drain ohmic contact region, respectively, the step S07 further comprises a step of:

stripping off the photoresist so as to expose two portions of the active layer adjacent to the source ohmic contact region and the drain ohmic contact region, and the step S08 further comprises a step of:

performing ion implantation on the active layer so that the two exposed portions of the active layer after stripping off the photoresist become lightly doped regions, and the portion of the active layer shielded by the gate becomes the channel region.

the step S04 further comprises steps of:

forming a layer of the photoresist on the gate metal layer, shielding the photoresist using a gray scale mask plate and patterning the photoresist through an exposure and a development, so that the photoresist is completely located within the region where the active layer is located, a part of the photoresist corresponding to a complete transmission area of the gray scale mask plate is removed, a part of the photoresist corresponding to a semi-light-transmitting area of the gray scale mask plate is partially remained to form the partially preserved area, a part of the photoresist corresponding to a shielding area of the gray scale mask plate is completely remained to form the completely preserved area.

To solve the above problems, another aspect of the present invention provides a manufacturing method of a thin film transistor, comprising steps of:

S01, forming an active layer on a base substrate;

S02, forming a gate insulation layer on the active layer;

S03, forming a gate metal layer on the gate insulation layer;

S04, forming a layer of patterned photoresist, which is completely located within a region where the active layer is located;

S05, over-etching the gate metal layer to form a gate, so that the photoresist is suspended at two ends thereof;

S06, thinning the photoresist so as to enable ions to pass through therein;

S07, performing ion implantation on the active layer, so that a portion of the active layer not shielded by the photoresist and/or the gate becomes an ohmic contact region, a portion of the active shielded only by the photoresist becomes a lightly doped region, and a portion of the active layer shielded by both the photoresist and the gate becomes a channel region;

S08, stripping off the photoresist;

S09, forming an interlayer insulation layer above the gate, and forming through holes in the interlayer insulation layer and the gate insulation layer by a patterning process above the ohmic contact region; and S10, forming a source-drain metal layer above the interlayer insulation layer and in the through holes, and forming a source and a drain through a patterning process, wherein the source and the drain are electrically connected to the ohmic contact region through the through holes respectively.

Preferably, the step S104 further comprises a step of:

forming the photoresist to include a completely preserved area and a partially preserved area located at one end of the completely preserved area, and the step S05 further comprises steps of:

over-etching the gate metal layer to form the gate, so that the partially preserved area is suspended, and an end of the completely preserved area not connected to the partially preserved area is suspended; and removing the partially preserved area of the photoresist by an ashing process, so that only the end of the completely preserved area of the photoresist not connected to the partially preserved area is suspended.

Preferably, the ohmic contact region includes a source ohmic contact region and a drain ohmic contact region, and the step S07 further comprises a step of:

performing ion implantation on the active layer, so that regions of the active layer not shielded by the photoresist and/or the gate become the source ohmic contact region and the drain ohmic contact region, respectively, the region of the active layer shielded only by the photoresist becomes a lightly doped region, and the region of the active layer shielded by both the photoresist and the gate becomes the channel region.

Preferably, the ohmic contact region includes a source ohmic contact region and a drain ohmic contact region, and the step S07 further comprises a step of:

performing ion implantation on the active layer, so that regions of the active layer not shielded by the photoresist and/or the gate become the source ohmic contact region and the drain ohmic contact region, respectively, two regions of the active layer shielded only by the photoresist become lightly doped regions, and the region of the active layer shielded by both the photoresist and the gate becomes the channel region.

Preferably, the step S04 further comprises steps of:

forming a layer of the photoresist on the gate metal layer, shielding the photoresist using a gray scale mask plate and patterning the photoresist through an exposure and a development, so that the photoresist is completely located within the region where the active layer is located, a part of the photoresist corresponding to a complete transmission area of the gray scale mask plate is removed, a part of the photoresist corresponding to a semi-light-transmitting area of the gray scale mask plate is partially remained to form the partially preserved area, a part of the photoresist corresponding to a shielding area of the gray scale mask plate is completely remained to form the completely preserved area.

To solve the above problems, still another aspect of the present invention provides a thin film transistor, comprising an active layer, a gate insulation layer, a gate, an interlayer insulation layer, a source and a drain, the interlayer insulation layer and the gate insulation layer are provided therein with through holes corresponding to the source and the drain;

the active layer includes a source ohmic contact region connected to the source, a drain ohmic contact region connected to the drain, a channel region serving as a channel located below the gate and a lightly doped region between the drain ohmic contact region and the channel region, or the active layer includes a source ohmic contact region connected to the source, a drain ohmic contact region connected to the drain, a channel region serving as a channel located below the gate and two lightly doped regions between the drain ohmic contact region and the channel region and between the source ohmic contact region and the channel region.

To solve the above problems, yet another aspect of the present invention provides a manufacturing method of an array substrate, comprising the above manufacturing method of a thin film transistor.

To solve the above problems, yet another aspect of the present invention provides an array substrate comprising the above thin film transistor.

Embodiments of the present invention provide a thin film transistor and a manufacturing method thereof, the manufacturing method of the thin film transistor comprises a step of forming an active layer, a gate insulation layer, a gate, an interlayer insulation layer, a source and a drain on a base substrate, wherein the active layer comprises a source ohmic contact region, a drain ohmic contact region, a channel region and one or two lightly doped regions, the lightly doped region increases the series resistance between the source and the drain, decreases the electric field at the edges of the drain or the electric fields at the edges of both the source and the drain, suppresses the generation of the carriers, and thus decreases the leakage current of the thin film transistor.

In addition, embodiments of the present invention further provide a manufacturing method of an array substrate, which comprises any one of the above manufacturing methods of thin film transistor.

DESCRIPTION OF THE DRAWINGS

In order to explain embodiments of the present invention or technical solutions in the prior art clearly, drawings needed to be used in the description of the embodiments will be simply introduced hereinafter, obviously, the drawings in the following description are only some embodiments of the present invention, for a person skilled in the art, other drawings may be obtained according to these drawings without creative labor.

REFERENCE SYMBOLS

1—base substrate; 2—active layer; 21—source ohmic contact; 22—drain ohmic contact; 23—lightly doped region; 24—channel region; 3—gate insulation layer; 4—gate metal layer; 41—pre-gate-structure; 42—gate; 5—photoresist; 52—completely preserved region; 52—partially preserved region; 6—interlayer insulation layer; 7—through hole; 8—source; 9—drain.

DETAILED DESCRIPTION OF EMBODIMENTS

Technical solutions in the embodiments of the present invention will be described clearly and completely below in conjunction with the drawings in the embodiments of the present invention, obviously, the described embodiments are a part of embodiments of the present invention, not all the embodiments. On the basis of the embodiments of the present invention, all other embodiments obtained by a person skilled in the art without creative work fall within the scope of the present invention.

First Embodiment

Figure 1:
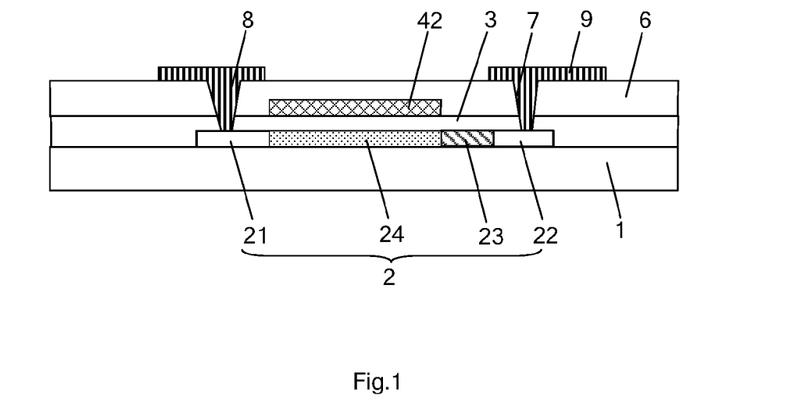
FIG. 1 is a diagram of a first implementation of thin film transistor of an embodiment of the present invention.
Figure 2:
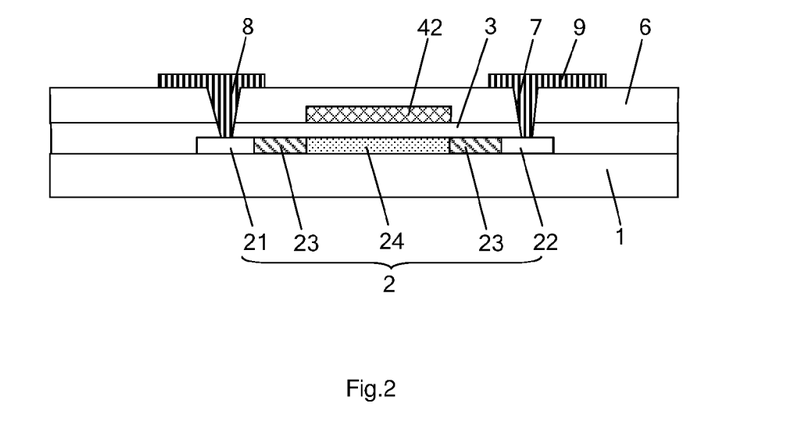
FIG. 2 is a diagram of a second implementation of thin film transistor of an embodiment of the present invention.

The embodiment of the present invention provides a manufacturing method of a thin film transistor, which comprises a step of:

forming an active layer, a gate insulation layer, a gate, an interlayer insulation layer, a source and a drain, the interlayer insulation layer and the gate insulation layer are provided therein with through holes corresponding to the source and the drain, so that the thin film transistor as shown in FIG. 1 or FIG. 2 may be formed.

In a case that the formed thin film transistor has a structure as shown in FIG. 1, the active layer 2 comprises a source ohmic contact region 21 connected to the source 8, a drain ohmic contact region 22 connected to the drain 9, a channel region 24 serving as a channel provided below the gate 42 and a slightly doped region between the drain ohmic contact region 22 and the channel region 24.

In a case that the formed thin film transistor has a structure as shown in FIG. 2, the active layer 2 comprises a source ohmic contact region 21 connected to the source 8, a drain ohmic contact region 22 connected to the drain 9, a channel region 24 serving as a channel provided below the gate 42, and two slightly doped regions 23 respectively provided between the drain ohmic contact region 22 and the channel region 24 and between the source ohmic contact region 21 and the channel region 24.

Since hot carriers forming the leakage current is mainly concentrated in the vicinity of the drain 9, the leakage current of the thin film transistor can be effectively decreased in the case that the formed active layer 2 only comprises the slightly doped region 23 between the drain ohmic contact region 22 and the channel region 24. Compared with the thin film transistor in which the active layer 2 comprising two slightly doped regions 23 as shown in FIG. 2, in the case that the formed active layer 2 only comprises the slightly doped region 23 between the drain ohmic contact region 22 and the channel region 24, the carrier mobility of the thin film transistor is higher, the on-state current of the thin film transistor is larger, and thus the comprehensive performance of the thin film transistor is better.

Furthermore, the manufacturing method of a thin film transistor may further comprises other steps, for example, a step of forming a buffer layer located between the base substrate 1 and the active layer 2, wherein the buffer is configured to isolate the base substrate 1 from the active layer 2, avoiding the performance of the thin film transistor from being influenced due to impurities in the base substrate 1 entering into the active layer 2, moreover, the buffer layer may also reduce the influence of temperature on the base substrate 1 during the formation of the active layer 2. The buffer layer may be formed of silicon oxide or silicon nitride.

The embodiment of the present invention provides a manufacturing method of a thin film transistor, the manufacturing method of the thin film transistor comprises a step of forming an active layer, a gate insulation layer, a gate, an interlayer insulation layer, a source and a drain, wherein the active layer comprises a source ohmic contact region, a drain ohmic contact region, a channel region and one or two lightly doped regions, the lightly doped region increases the series resistance between the source and the drain, decreases the electric field at the edges of the drain or the electric fields at the edges of both the source and the drain, suppresses the generation of the carriers, and thus decreases the leakage current of the thin film transistor.

Second Embodiment

The embodiment of the present invention provides three implementations of manufacturing method of the thin film transistor as shown in FIG. 1.

Figure 3:
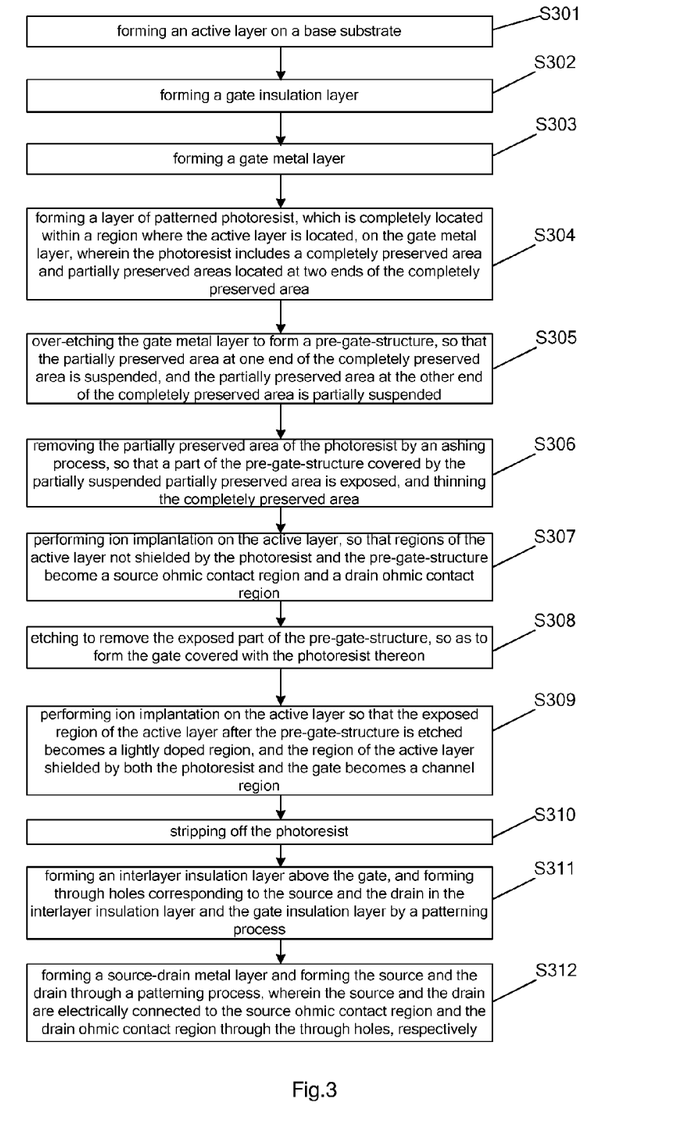
FIG. 3 is a flowchart of a first implementation of manufacturing method of the thin film transistor in FIG. 1.
Figure 4:
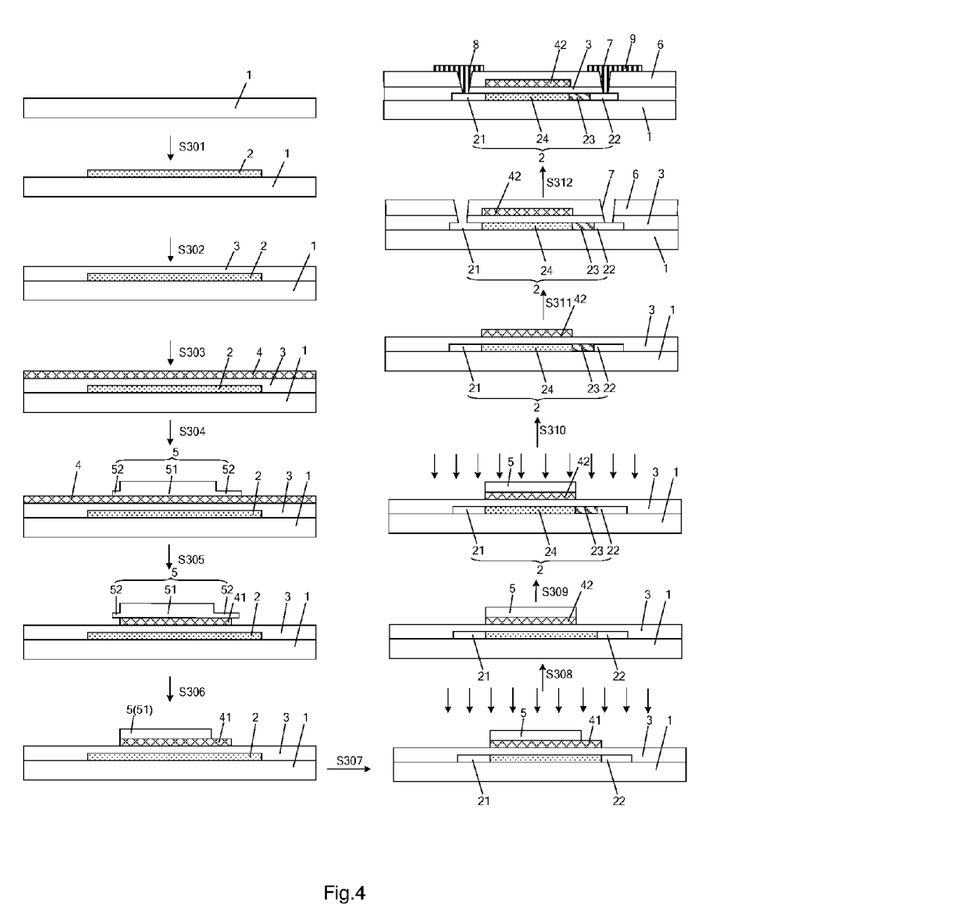
FIG. 4 is a diagram of a manufacturing procedure of the manufacturing method in FIG. 3.

A flow chart of a first implementation of manufacturing method is shown in FIG. 3, and a diagram of a manufacturing process is shown in FIG. 4.

Step S301, forming an active layer 2 on a base substrate 1.

A layer of amorphous silicon is formed on the base substrate 1 first, and then converted into polycrystalline silicon through a crystallization process. The crystallization process includes a laser annealing process, a metal inducing process etc. The crystallization process adopted in embodiments of the present invention is preferably the laser annealing process, specifically, the basic principle of the laser annealing process is in that: the surface of the amorphous silicon is irradiated by using a high energy excimer laser, the amorphous silicon is melt, and then cooled and recrystallized, so that the amorphous silicon is converted into the polycrystalline silicon. Then, the polycrystalline silicon is coated with a layer of photoresist thereon, and then forms an active layer 2 after exposure, development, etching and stripping off the photoresist.

Step S302, forming a gate insulation layer 3 on the active layer 2.

The gate insulation layer 3 is formed, through a plasma enhanced chemical vapor deposition method and the like, on the base substrate 1 subjected to the step S301.

Step S303, forming a gate metal layer 4 on the gate insulation layer 3.

The gate metal layer 4 is formed, through a sputtering method, a thermal evaporation method or the like, on the base substrate 1 subjected to the step S302.

Step S304, forming a layer of patterned photoresist 5, which is completely located within a region where the active layer 2 is located, on the gate metal layer 4, wherein the photoresist 5 includes a completely preserved area 51 and partially preserved areas 52 located at two ends of the completely preserved area.

Step S305, over-etching the gate metal layer 4 to form a pre-gate-structure 41, so that the partially preserved area 52 at one end of the completely preserved area 51 is suspended, and the partially preserved area 52 at the other end of the completely preserved area 51 is partially suspended.

The gate metal layer 4 is over-etched to some extent, so that the formed pre-gate-structure 41 after etching has a size smaller than that of the patterned photoresist 5, and in turn the partially preserved area 52 at one end of the completely preserved area 51 is suspended, and a part of the partially preserved area 52 at the other end of the completely preserved area 51 is suspended.

Step S306, removing the partially preserved area 52 of the photoresist 5 by an ashing process, so that a part of the pre-gate-structure 41 covered by the partially suspended partially preserved area 52 is exposed, and thinning the completely preserved area 51.

It should be noted that, although the completely preserved area is thinned herein, an overall thickness of the completely preserved area 51 is still enough to disable ions to pass through therein in the subsequent ion implantation process.

Step S307, performing ion implantation on the active layer 2, so that regions of the active layer 2 not shielded by the photoresist 5 and the pre-gate-structure 41 become a source ohmic contact region 21 and a drain ohmic contact region 22.

Exemplarily, in this method, P elements are doped into the active layer 2 through an ion implantation method, wherein regions of the active layer 2 not shielded by the photoresist 5 and the pre-gate-structure 41 are doped with the P elements, so that the concentration of electrons in these regions is increased, the source ohmic contact region 21 and the drain ohmic contact region 22 are formed, and a region of the active layer 2 shielded by the photoresist 5 and/or the pre-gate-structure 41 is not doped with the P elements.

Step S308, etching to remove the exposed part of the pre-gate-structure 41 not covered by the photoresist 5, so as to form the gate 42, as shown in the figure, the gate 42 is covered with the photoresist 5 thereon.

Step S309, performing ion implantation on the active layer 2 so that the exposed region of the active layer 2 after the pre-gate-structure 41 is etched becomes a lightly doped region 23, and the region of the active layer 2 shielded by both the photoresist 5 and the gate 42 becomes a channel region 24.

Exemplarily, in this method, P elements less than that in the step S307 are doped into the active layer 2 through an ion implantation method, wherein the exposed region of the active layer 2 after the pre-gate-structure 41 is etched becomes the lightly doped region 23, and the region of the active layer 2 shielded by both the photoresist 5 and the gate 42 is still not doped with P elements and becomes a channel region 24.

Step S310, stripping off the photoresist 5.

Step S311, forming an interlayer insulation layer 6 above the gate 42, and forming through holes 7 corresponding to the source 8 and the drain 9 in the interlayer insulation layer 6 and the gate insulation layer 3 by a patterning process.

The interlayer insulation layer 6 is formed on the base substrate 1 subjected to the step S310 through a plasma enhanced chemical vapor deposition method and the like, and the through holes 7 corresponding to the source 8 and the drain 9 are formed in the interlayer insulation layer 6 and the gate insulation layer 3 by a patterning process including coating photoresist, shielding using a mask plate, an exposure, a development, etching and stripping off the photoresist, wherein the through holes 7 are located above the source ohmic contact region 21 and the drain ohmic contact region 22, respectively.

Step S312, forming a source-drain metal layer above the interlayer insulation layer 6 and in the through holes 7, and forming the source 8 and the drain 9 through a patterning process, wherein the source 8 and the drain 9 are electrically connected to the source ohmic contact region 21 and the drain ohmic contact region 22 through the through holes 7, respectively.

The source-drain metal layer is formed on the base substrate 1 subjected to the step S311 through a sputtering method, a thermal evaporation method or the like, wherein the through holes 7 is also formed with the source-drain metal layer therein, then the source 8 and the drain 9 are formed through a patterning process including coating photoresist, shielding using a mask plate, an exposure, a development, etching and stripping off the photoresist, the source 8 and the drain 9 are electrically connected to the source ohmic contact region 21 and the drain ohmic contact region 22 through the through holes 7, respectively.

Figure 5:
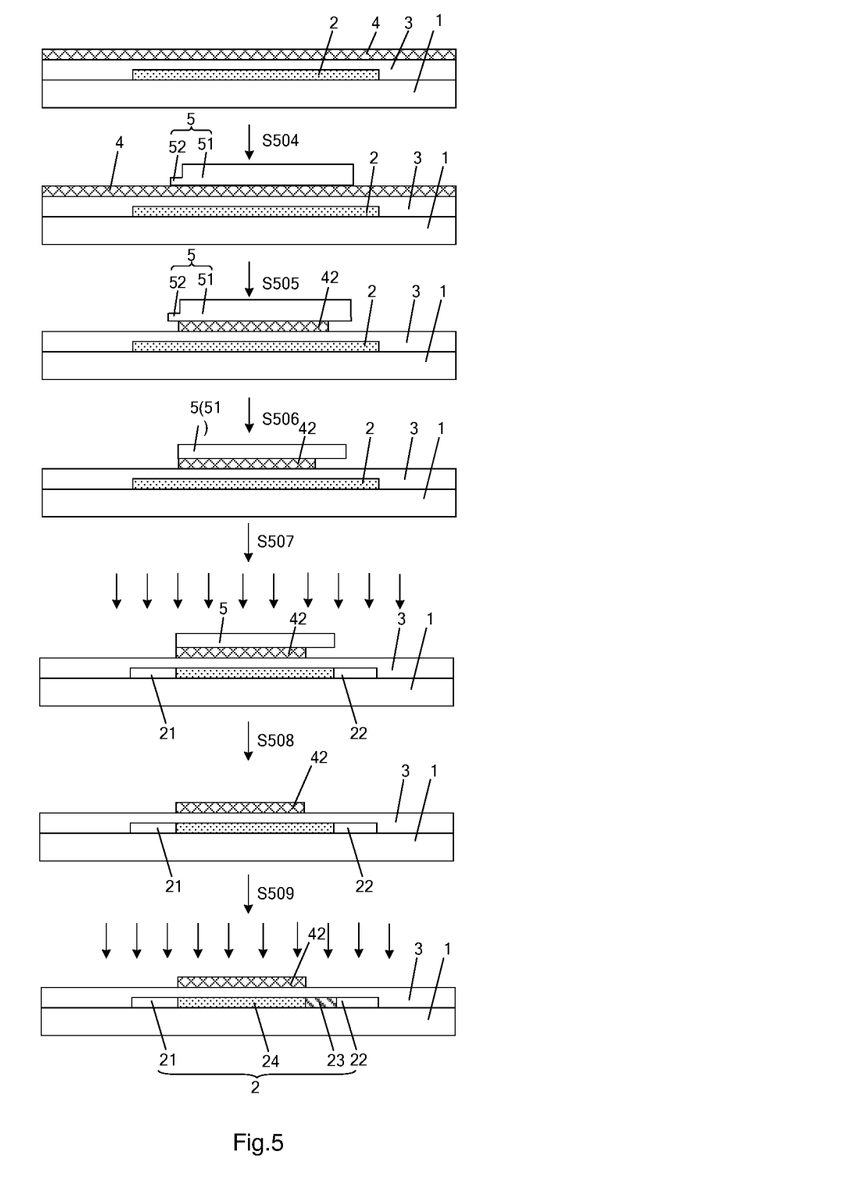
FIG. 5 is a diagram of a partial procedure of a second implementation of manufacturing method of the thin film transistor in FIG. 1.

A second implementation of manufacturing method comprises the following steps, steps S501-S503 in the second implementation of manufacturing method are the same as steps S301-S303 in the first implementation of manufacturing method, steps S510-S511 in the second implementation of manufacturing method are the same as steps S311-S312 in the first implementation of manufacturing method, FIG. 5 only shows steps S504-S509.

Step S501, forming an active layer 2 on a base substrate 1.

Step S502, forming a gate insulation layer 3 on the active layer 2.

Step S503, forming a gate metal layer 4 on the gate insulation layer 3.

Step S504, forming a layer of patterned photoresist 5, which is completely located within a region where the active layer 2 is located, on the gate metal layer 4, wherein the photoresist 5 includes a completely preserved area 51 and a partially preserved area 52 located at one end of the completely preserved area.

Step S505, over-etching the gate metal layer 4 to form a gate 42, so that the partially preserved area 52 is suspended, and one end of the completely preserved area 51 not connected to the partially preserved area is suspended.

Step S506, removing the partially preserved area 52 of the photoresist 5 by an ashing process, and thinning the completely preserved area 51.

It should be noted that, although the photoresist 5 in the completely preserved area is thinned herein, an overall thickness of the completely preserved area is still enough to disable ions to pass through therein in the subsequent ion implantation process.

Step S507, performing ion implantation on the active layer 2, so that regions of the active layer 2 not shielded by the photoresist 5 and the gate 42 become a source ohmic contact region 21 and a drain ohmic contact region 22.

Exemplarily, in this method, P elements are doped into the active layer 2 through an ion implantation method, wherein regions of the active layer 2 not shielded by the photoresist 5 and the gate 42 are doped with the P elements, so that the source ohmic contact region 21 and the drain ohmic contact region 22 are formed, and regions of the active layer 2 shielded by the photoresist 5 and/or the gate 42 are not doped with the P elements.

Step S508, stripping off the photoresist 5.

Step S509, performing ion implantation on the active layer 2 so that the exposed region of the active layer 2 after the photoresist 5 is stripped off becomes a lightly doped region 23, and the region of the active layer 2 shielded by the gate 42 becomes a channel region 24.

Exemplarily, P elements less than that in the step S507 are doped into the active layer 2 through an ion implantation method, wherein the exposed region of the active layer 2 after the photoresist 5 is stripped off becomes the lightly doped region 23, and the region of the active layer 2 shielded by the gate 42 is still not doped with P elements and becomes the channel region 24.

Step S510, forming an interlayer insulation layer 6 above the gate 42, and forming through holes 7 corresponding to the source 8 and the drain 9 in the interlayer insulation layer 6 and the gate insulation layer 3 by a patterning process.

Step S511, forming a source-drain metal layer above the interlayer insulation layer 6 and in the through holes 7, and forming the source 8 and the drain 9 through a patterning process, wherein the source 8 and the drain 9 are electrically connected to the source ohmic contact region 21 and the drain ohmic contact region 22 through the through holes 7, respectively.

Figure 6:
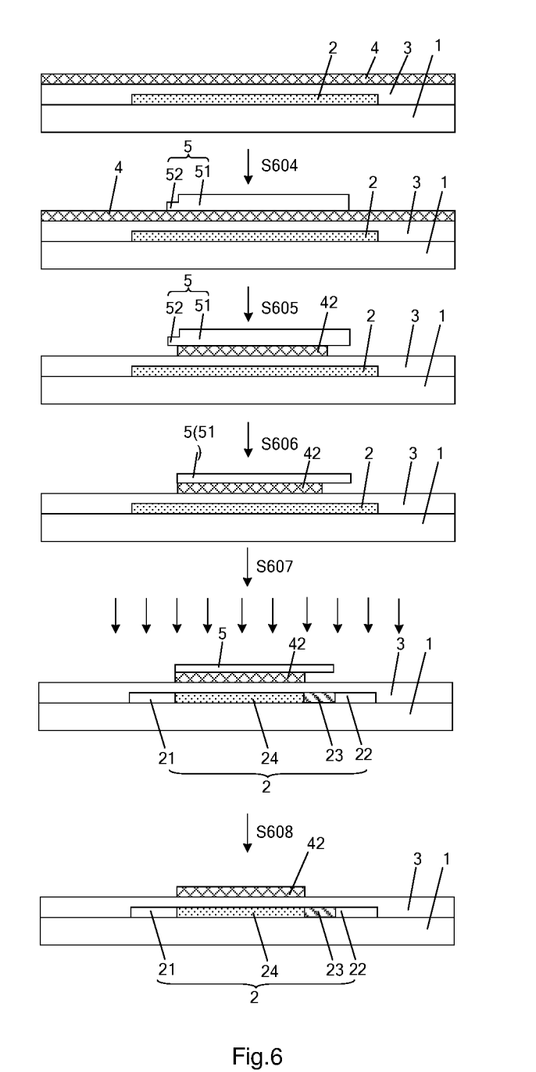
FIG. 6 is a diagram of a partial procedure of a third implementation of manufacturing method of the thin film transistor in FIG. 1.

A third implementation of manufacturing method comprises the following steps, steps S601-S603 in the third implementation of manufacturing method are the same as steps S301-S303 in the first implementation of manufacturing method, steps S609-S610 in the third implementation of manufacturing method are the same as steps S311-S312 in the first implementation of manufacturing method, FIG. 6 only shows steps S604-S608.

Step S601, forming an active layer 2 on a base substrate 1.

Step S602, forming a gate insulation layer 3 on the active layer 2.

Step S603, forming a gate metal layer 4 on the gate insulation layer 3.

Step S604, forming a layer of patterned photoresist 5, which is completely located within a region where the active layer 2 is located, on the gate metal layer 4, wherein the photoresist 5 includes a completely preserved area 51 and a partially preserved area 52 located at one end of the completely preserved area.

Step S605, over-etching the gate metal layer 4 to form a gate 42, so that the partially preserved area 52 is suspended, and one end of the completely preserved area 51 not connected to the partially preserved area 52 is suspended.

Step S606, removing the partially preserved area 52 of the photoresist 5 by an ashing process, and thinning the completely preserved area 51.

It should be noted that, after the photoresist 5 in the completely preserved area 51 is thinned herein, an overall thickness of the completely preserved area is small, so that a small amount of ions pass through therein in the subsequent ion implantation process.

Step S607, performing ion implantation on the active layer 2, so that regions of the active layer 2 not shielded by the photoresist 5 and the gate 42 become a source ohmic contact region 21 and a drain ohmic contact region 22. A region of the active layer 2 shielded only by the photoresist 5 becomes a lightly doped region 23, and a region of the active layer 2 shielded by both the photoresist 5 and the gate 42 becomes a channel region 24.

Exemplarily, in this method, P elements are doped into the active layer 2 through an ion implantation method, wherein regions of the active layer 2 not shielded by the photoresist 5 and the gate 42 are doped with a large amount of the P elements and become the source ohmic contact region 21 and the drain ohmic contact region 22. A region of the active layer 2 shielded only by the photoresist 5 is implanted with a little amount of ions (that is, the doped amount is small) and becomes the lightly doped region 23, a region of the active layer 2 shielded by both the photoresist 5 and the gate 42 is not doped with ions (that is, zero doping) and becomes the channel region 24.

Step S608, stripping off the photoresist 5.

Step S609, forming an interlayer insulation layer 6 above the gate 42, and forming through holes 7 corresponding to the source 8 and the drain 9 in the interlayer insulation layer 6 and the gate insulation layer 3 by a patterning process.

Step S610, forming a source-drain metal layer above the interlayer insulation layer 6 and in the through holes 7, and forming the source 8 and the drain 9 through a patterning process, wherein the source 8 and the drain 9 are electrically connected to the source ohmic contact region 21 and the drain ohmic contact region 22 through the through holes 7, respectively.

Third Embodiment

The embodiment of the present invention provides three implementations of manufacturing method of thin film transistor as shown in FIG. 2.

Figure 7:
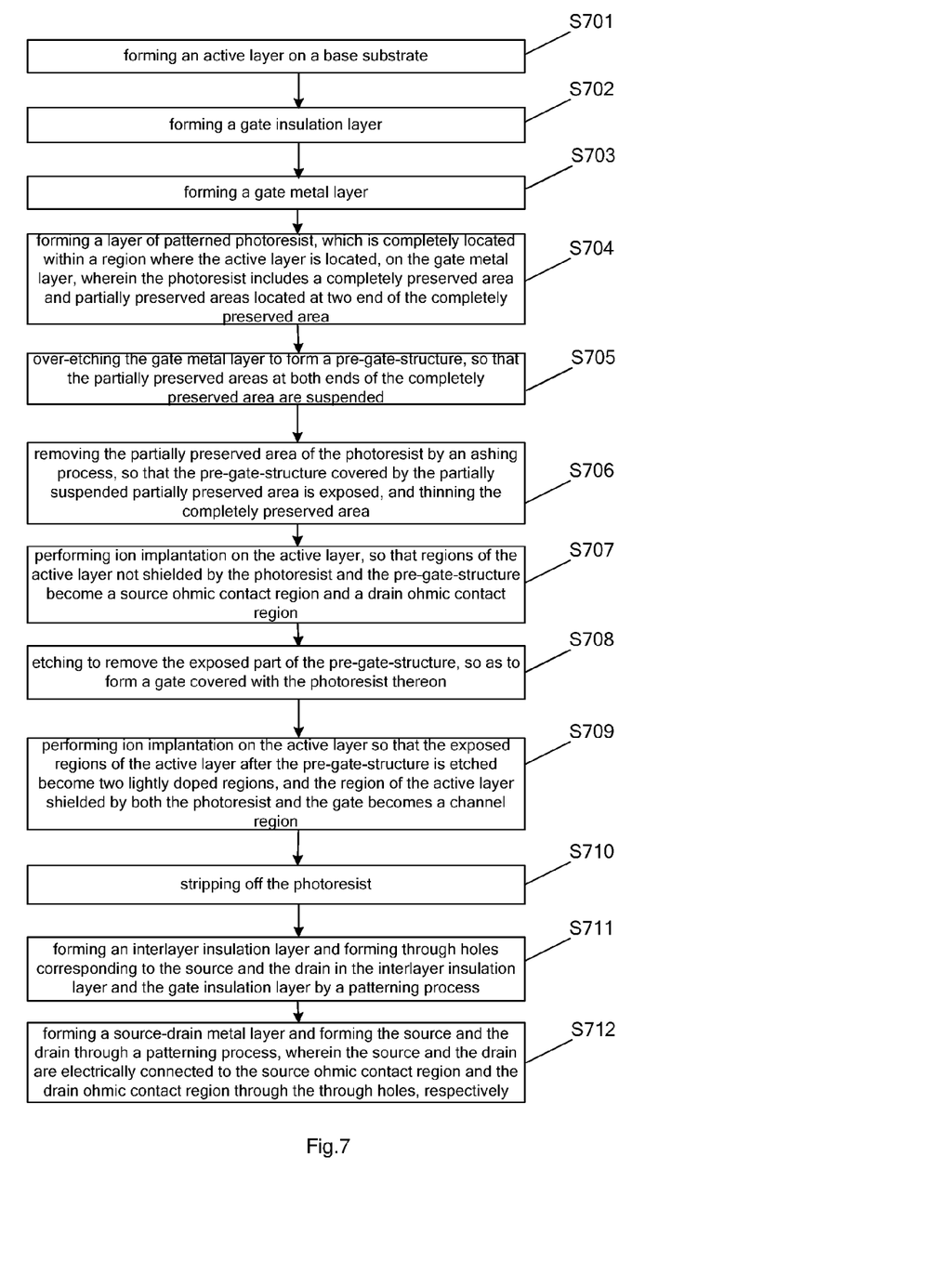
FIG. 7 is a flowchart of a first implementation of manufacturing method of the thin film transistor in FIG. 2.
Figure 8:
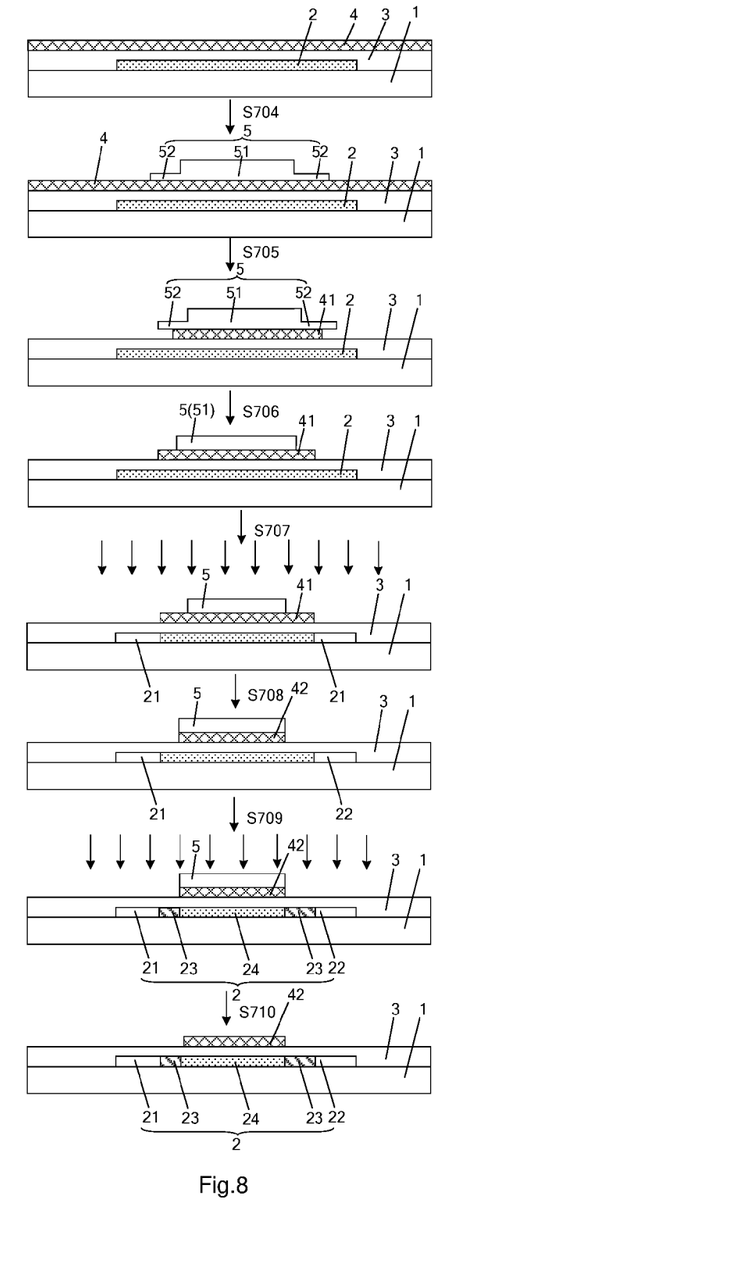
FIG. 8 is a diagram of a manufacturing procedure of the manufacturing method in FIG. 7.

A first implementation of manufacturing method comprises the steps as shown in FIG. 7, wherein steps S701-S703 in the first implementation of manufacturing method are the same as steps S301-S303 in the first implementation of manufacturing method in the second embodiment, steps S711-S712 in the first implementation of manufacturing method are the same as steps S311-S312 in the first implementation of manufacturing method in the second embodiment, FIG. 8 only shows steps S704-S710.

Step S701, forming an active layer 2 on a base substrate 1.

Step S702, forming a gate insulation layer 3 on the active layer 2.

Step S703, forming a gate metal layer 4 on the gate insulation layer 3.

Step S704, forming a layer of patterned photoresist 5, which is completely located within a region where the active layer 2 is located, on the gate metal layer 4, wherein the photoresist 5 includes a completely preserved area 51 and partially preserved areas 52 located at two end of the completely preserved area.

Step S705, over-etching the gate metal layer 4 to form a pre-gate-structure 41, so that the partially preserved areas 52 at both ends of the completely preserved area 51 are suspended.

Step S706, removing the partially preserved area 52 of the photoresist 5 by an ashing process, so that the pre-gate-structure 41 covered by the partially suspended partially preserved areas is exposed, and thinning the completely preserved area 51.

It should be noted that, although the completely preserved area 51 is thinned herein, an overall thickness of the completely preserved area 51 is still enough to disable ions to pass through therein in the subsequent ion implantation process.

Step S707, performing ion implantation on the active layer 2, so that regions of the active layer 2 not shielded by the photoresist 5 and the pre-gate-structure 41 become a source ohmic contact region 21 and a drain ohmic contact region 22.

Exemplarily, in this method, P elements are doped into the active layer 2 through an ion implantation method, wherein regions of the active layer 2 not shielded by the photoresist 5 and the pre-gate-structure 41 are doped with the P elements, so that the source ohmic contact region 21 and the drain ohmic contact region 22 are formed, and a region of the active layer 2 shielded by the photoresist 5 and/or the pre-gate-structure 41 is not doped with the P elements.

Step S708, etching to remove the exposed part of the pre-gate-structure 41 by shielding of the photoresist 5, so as to form a gate 42, wherein the formed gate 42 is covered with the photoresist 5 thereon.

Step S709, performing ion implantation on the active layer 2 so that the exposed regions of the active layer 2 after the pre-gate-structure 41 is etched become two lightly doped regions 23, and the region of the active layer 2 shielded by both the photoresist 5 and the gate 42 becomes a channel region 24.

Exemplarily, in this method, P elements less than that in the step S707 are doped into the active layer 2 through an ion implantation method, wherein the exposed regions of the active layer 2 after the pre-gate-structure 41 is etched become the two lightly doped regions 23, and the region of the active layer 2 shielded by both the photoresist 5 and the gate 42 is still not doped with P elements and becomes a channel region 24.

Step S710, stripping off the photoresist 5.

Step S711, forming an interlayer insulation layer 6 above the gate 42, and forming through holes 7 corresponding to the source 8 and the drain 9 in the interlayer insulation layer 6 and the gate insulation layer 3 by a patterning process.

Step S712, forming a source-drain metal layer above the interlayer insulation layer 6 and in the through holes 7, and forming the source 8 and the drain 9 through a patterning process, wherein the source 8 and the drain 9 are electrically connected to the source ohmic contact region 21 and the drain ohmic contact region 22 through the through holes 7, respectively.

Figure 9:
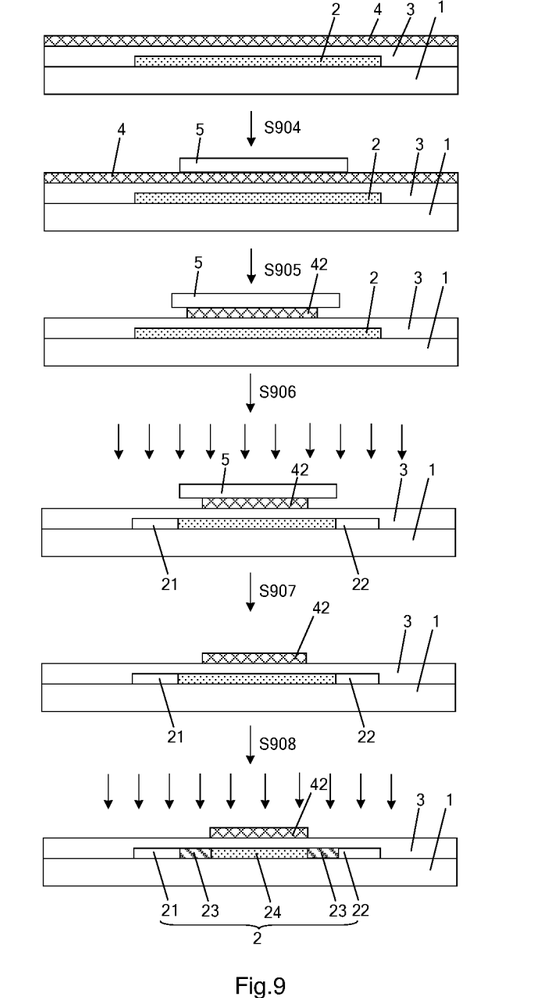
FIG. 9 is a diagram of a partial procedure of a second implementation of manufacturing method of the thin film transistor in FIG. 2.

A second implementation of manufacturing method comprises the following steps, steps S901-S903 in the second implementation of manufacturing method are the same as steps S301-S303 in the first implementation of manufacturing method of the second embodiment, steps S909-S910 in the second implementation of manufacturing method are the same as steps S311-S312 in the first implementation of manufacturing method of the second embodiment, FIG. 9 only shows steps S904-S908.

Step S901, forming an active layer 2 on a base substrate 1.

Step S902, forming a gate insulation layer 3 on the active layer 2.

Step S903, forming a gate metal layer 4 on the gate insulation layer 3.

Step S904, forming a layer of patterned photoresist 5, which is completely located within a region where the active layer 2 is located, on the gate metal layer 4.

It should be noted that the thickness of the photoresist 5 is large so that ions cannot pass through therein in the subsequent ion implantation.

Step S905, over-etching the gate metal layer 4 to form a gate 42, so that the photoresist 5 is suspended at two ends thereof.

Step S906, performing ion implantation on the active layer 2, so that regions of the active layer 2 not shielded by the photoresist 5 and the gate 42 become a source ohmic contact region 21 and a drain ohmic contact region 22.

Exemplarily, in this method, P elements are doped into the active layer 2 through an ion implantation method, wherein regions of the active layer 2 not shielded by the photoresist 5 and the gate 42 are doped with the P elements, so that the source ohmic contact region 21 and the drain ohmic contact region 22 are formed, and regions of the active layer 2 shielded by the photoresist 5 and/or the gate 42 are not doped with the P elements.

Step S907, stripping off the photoresist 5.

Step S908, performing ion implantation on the active layer 2 so that the exposed regions of the active layer 2 due to stripping off the photoresist 5 become two lightly doped regions 23, and the region of the active layer 2 shielded by the gate 42 becomes a channel region 24.

Exemplarily, P elements less than that in the step S906 are doped into the active layer 2 through an ion implantation method, so that the exposed regions of the active layer 2 due to stripping off the photoresist 5 becomes two lightly doped regions 23, and the region of the active layer 2 shielded by the gate 42 is still not doped with P elements and becomes the channel region 24.

Step S909, forming an interlayer insulation layer 6 above the gate 42, and forming through holes 7 corresponding to the source 8 and the drain 9 in the interlayer insulation layer 6 and the gate insulation layer 3 by a patterning process.

Step S910, forming a source-drain metal layer above the interlayer insulation layer 6 and in the through holes 7, and forming the source 8 and the drain 9 through a patterning process, wherein the source 8 and the drain 9 are electrically connected to the source ohmic contact region 21 and the drain ohmic contact region 22 through the through holes 7, respectively.

Figure 10:
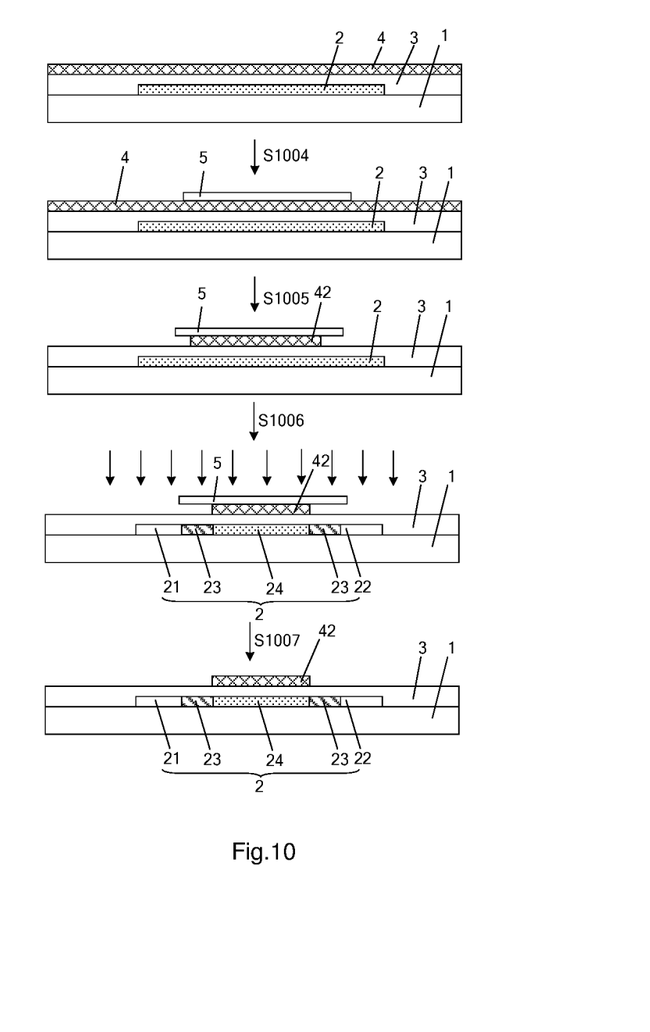
FIG. 10 is a diagram of a partial procedure of a third implementation of manufacturing method of the thin film transistor in FIG. 2.

A third implementation of manufacturing method comprises the following steps, steps S1001-S1003 in the third implementation of manufacturing method are the same as steps S301-S303 in the first implementation of manufacturing method of the second embodiment, steps S1008-S1009 in the third implementation of manufacturing method are the same as steps S311-S312 in the first implementation of manufacturing method of the second embodiment, FIG. 10 only shows steps S1004-S1007.

Step S1001, forming an active layer 2 on a base substrate 1.

Step S1002, forming a gate insulation layer 3 on the active layer 2.

Step S1003, forming a gate metal layer 4 on the gate insulation layer 3.

Step S1004, forming a layer of patterned photoresist 5, which is completely located within a region where the active layer 2 is located, on the gate metal layer 4.

It should be noted that the thickness of the photoresist 5 is small so that part of ions can pass through therein in the subsequent ion implantation.

Step S1005, over-etching the gate metal layer 4 to form a gate 42, so that the photoresist 5 is suspended at two ends thereof.

Step S1006, performing ion implantation on the active layer 2, so that regions of the active layer 2 not shielded by the photoresist 5 and the gate 42 become a source ohmic contact region 21 and a drain ohmic contact region 22. Regions of the active layer 2 shielded only by the photoresist 5 become two lightly doped regions 23, a region of the active layer 2 shielded by both the photoresist 5 and the gate 42 becomes a channel region 24.

Exemplarily, in this method, P elements are doped into the active layer 2 through an ion implantation method, wherein regions of the active layer 2 not shielded by the photoresist 5 and the gate 42 become the source ohmic contact region 21 and the drain ohmic contact region 22, regions of the active layer 2 shielded only by the photoresist 5 become two lightly doped regions 23, a region of the active layer 2 shielded by both the photoresist 5 and the gate 42 becomes the channel region 24.

Step S1007, stripping off the photoresist 5.

Step S1008, forming an interlayer insulation layer 6 above the gate 42, and forming through holes 7 corresponding to the source 8 and the drain 9 in the interlayer insulation layer 6 and the gate insulation layer 3 by a patterning process.

Step S1009, forming a source-drain metal layer above the interlayer insulation layer 6 and in the through holes 7, and forming the source 8 and the drain 9 through a patterning process, wherein the source 8 and the drain 9 are electrically connected to the source ohmic contact region 21 and the drain ohmic contact region 22 through the through holes 7, respectively.

Fourth Embodiment

The steps S304, S504 and S604 in the second embodiment and the step S704 in the third embodiment specifically include:

forming a layer of the photoresist 5 on the gate metal layer 4, shielding the photoresist 5 using a gray scale mask plate and patterning the photoresist 5 through an exposure and a development, so that the photoresist 5 is completely located within the region where the active layer is located, a part of the photoresist 5 corresponding to a complete transmission area of the gray scale mask plate is removed, a part of the photoresist 5 corresponding to a semi-light-transmitting area of the gray scale mask plate is partially remained to form the partially preserved area 52, a part of the photoresist 5 corresponding to a shielding area of the gray scale mask plate is completely remained to form the completely preserved area 51.

So far, the manufacturing methods of thin film transistor provided by the embodiments of the present application only require four mask plates, but the manufacturing method of the thin film transistor, in which the active layer does not include the lightly doped regions, also requires four mask plates, therefore, the manufacturing methods of thin film transistor provided by the embodiments of the present application can enable the active layer 2 of the formed transistor to include the source ohmic contact region 21, the drain ohmic contact region 22, the lightly doped region 23 and the channel region 24 without increasing the number of the mask plates, and thus the manufacturing method is simple and the cost is lower.

It should be further noted that, a length of the lightly doped region 23 formed by the above manufacturing methods can be determined by the etching amount of the over-etching for forming the pre-gate-structure 41 or the gate 42, since the etching amount in the over-etching can be accurately controlled, the length of the formed lightly doped region 23 is accurate, and in turn problems such as low mobility of the carriers of the thin film transistor due to too large length of the lightly doped region 23 or leakage current, which cannot be reduced, of the thin film transistor due to too small length of the lightly doped region 23 can be avoided.

In addition, before the steps S301, S501 and S601 of the manufacturing methods in the second embodiment, and before the steps S701, S901 and S1001 of the manufacturing methods in the third embodiment, the following step may be included:

forming a buffer layer on the base substrate 1.

In addition, an embodiment of the present invention further provides a manufacturing method of an array substrate, which includes any one of the above manufacturing methods of the thin film transistor. It should be noted that, the manufacturing method of an array substrate further includes steps of forming structures such as a passivation layer, a pixel electrode and the like, which will not be described in detail herein.

In addition, an embodiment of the present invention further provides an array substrate, which comprises the thin film transistor manufactured by any one of the above manufacturing methods.

It can be understood that the foregoing implementations are merely exemplary embodiments adopted for the purpose of explaining the principle of the present invention, but the present invention is not limited thereto. Various modifications and improvements can be made by those skilled in the art without departing from the spirit and essence of the present invention. These modifications and improvements shall also fall within the protection scope of the present invention.

What is claimed is:
1. A manufacturing method of a thin film transistor, comprising steps of:
S01, forming an active layer on a base substrate;
S02, forming a gate insulation layer on the active layer;
S03, forming a gate metal layer on the gate insulation layer;
S04, forming a photoresist which is patterned and is completely located within a region where the active layer is located;
S05, over-etching the gate metal layer to form a gate, so that the photoresist is suspended at two ends thereof;
S06, performing ion implantation on the active layer, so that a region of the active layer not shielded by the photoresist and the gate becomes an ohmic contact region;
S07, removing a part of the gate and/or a part of the photoresist on the gate, so as to expose a portion of the active layer adjacent to the ohmic contact region;
S08, performing an ion implantation on the active layer so that the exposed portion of the active layer adjacent to the ohmic contact region becomes a lightly doped region, and a portion of the active layer shielded by the photoresist and/or the gate becomes a channel region;
S09, stripping off the photoresist;
S10, forming an interlayer insulation layer above the gate, and forming through holes in the interlayer insulation layer and the gate insulation layer by a patterning process above the ohmic contact region; and
S11, forming a source-drain metal layer above the interlayer insulation layer and in the through holes, and forming a source and a drain through a patterning process, wherein the source and the drain are electrically connected to the ohmic contact region through the through holes respectively, wherein the step S04 further comprises a step of:
forming the photoresist to include a completely preserved area and partially preserved areas located at two ends of the completely preserved area, and the step S05 further comprises steps of:
over-etching the gate metal layer to form a pre-gate-structure, so that the partially preserved area at one end of the completely preserved area is suspended, and the partially preserved area at the other end of the completely preserved area is partially suspended; and
removing the partially preserved area of the photoresist at the one end of the completely preserved area by an ashing process, so that a part of the pre-gate-structure covered by the partially preserved area of the photoresist which is at the one end of the completely preserved area partially suspended is exposed, and thinning the completely preserved area, and wherein the ohmic contact region includes a source ohmic contact region and a drain ohmic contact region, and the step S06 further comprises a step of:
performing ion implantation on the active layer, so that regions of the active layer not shielded by the photoresist and/or the pre-gate-structure become the source ohmic contact region and the drain ohmic contact region, the step 07 further comprises a step of:
removing an exposed portion of the pre-gate-structure by etching to form the gate covered by the photoresist, so that a portion of the active layer adjacent to the drain ohmic contact region is exposed, and the step S08 further comprises a step of:
performing ion implantation on the active layer so that the exposed portion of the active layer adjacent to the drain ohmic contact region becomes the lightly doped region, and a portion of the active layer shielded by both the photoresist and the gate becomes the channel region.

2. The manufacturing method of a thin film transistor of claim 1, wherein the step S04 further comprises steps of:

forming a layer of the photoresist on the gate metal layer, shielding the photoresist using a gray scale mask plate and patterning the photoresist through an exposure and a development, so that the photoresist is completely located within the region where the active layer is located, a part of the photoresist corresponding to a complete transmission area of the gray scale mask plate is removed, a part of the photoresist corresponding to a semi-light-transmitting area of the gray scale mask plate is partially remained to form a partially preserved area at the one end of the completely preserved area, a part of the photoresist corresponding to a shielding area of the gray scale mask plate is completely remained to form the completely preserved area.

3. A manufacturing method of an array substrate, comprising providing a base substrate and forming pixels arranged in a matrix on the base substrate, each pixel is provided with a thin film transistor therein, wherein the manufacturing method of the array substrate further comprises forming the thin film transistor through the manufacturing method of a thin film transistor of claim 1 by using the base substrate as a base substrate for forming the thin film transistor.

* * * * *